(12) United States Patent
Miller et al.

(10) Patent No.: US 9,606,273 B2
(45) Date of Patent: Mar. 28, 2017

(54) DIFFRACTIVE MEMS DEVICE

(71) Applicant: Lumentum Operations LLC, Milpitas, CA (US)

(72) Inventors: John Michael Miller, Gatineau (CA); Wenlin Jin, Ottawa (CA)

(73) Assignee: Lumentum Operations LLC, Milpitas, CA (US)

( * ) Notice: Subject to any disclaimer, the term of this patent is extended or adjusted under 35 U.S.C. 154(b) by 572 days.

(21) Appl. No.: 13/721,307

(22) Filed: Dec. 20, 2012

(65) Prior Publication Data

US 2013/0176621 A1   Jul. 11, 2013

Related U.S. Application Data

(60) Provisional application No. 61/585,362, filed on Jan. 11, 2012.

(51) Int. Cl.
*G02B 5/18*   (2006.01)
*G02B 26/08*   (2006.01)

(52) U.S. Cl.
CPC ............. *G02B 5/18* (2013.01); *G02B 5/1861* (2013.01); *G02B 26/0833* (2013.01)

(58) Field of Classification Search
CPC ....... G02B 5/18; G02B 5/1876–5/1895; G02B 5/1842; G02B 5/1814; G02B 5/1861; G02B 26/0833; B81C 1/001; B81C 1/00015; B81C 1/00023; B81C 1/00055; B81C 1/00063; B81C 1/00103; B81C 1/00523; B81C 1/00531; B81C 1/00539; B81C 1/00547; B81C 2201/013; B81C 2201/0132
USPC ......... 359/558–576, 196.1–226.3; 216/2, 24; 427/162
See application file for complete search history.

(56) References Cited

U.S. PATENT DOCUMENTS

| | | | |
|---|---|---|---|
| 4,846,552 A | 7/1989 | Veldkamp et al. | 359/573 |
| 4,895,790 A | 1/1990 | Swanson et al. | 430/321 |
| 5,113,286 A | 5/1992 | Morrison | 359/569 |

(Continued)

FOREIGN PATENT DOCUMENTS

| | | | | |
|---|---|---|---|---|
| CA | 2379179 A | * | 2/2001 | |
| JP | 2007234916 | | 6/1991 | H01S 5/00 |
| JP | 3129890 A | | 8/2007 | H01S 5/0687 |

OTHER PUBLICATIONS

W. Huang, R.R.A. Syms, J. Stagg and A. Lohmann, E Proc.-Sci. Meas. Technol. vol. 151, No. 2, Mar. 2004.
Richard. R. A. Syms and Anke Lohmann, MOEMS Tuning Element for a Littrow External Cavity Laser, Journal of Microelectromechanical Systems, vol. 12, No. 6, Dec. 2003 p. 921.
S. Kim, G. Barbastathis and H.L. Tuller, MEMS for Optical Functionality, Journal of Electroceramics, 12, 133-144, 2004.

(Continued)

*Primary Examiner* — Scott J Sugarman
*Assistant Examiner* — Kristina Deherrera
(74) *Attorney, Agent, or Firm* — Harrity & Harrity, LLP

(57) ABSTRACT

A diffractive MEMS device has an in-plane binary reflective diffraction pattern formed in an outer surface of a tiltable platform. The binary reflective diffraction pattern includes rectangular or trapezoidal ridges and valleys, or grooves, of a same depth. The binary reflective diffractive pattern has a high diffraction efficiency even though the surfaces of the "grooves" or "ridges" are not perpendicular to the incoming optical beam. The diffraction pattern is supported by a pair of torsional hinges and is tiltable by an electrostatic actuator. The electrostatic actuator can include at least one side electrode for linearization of dependence of tilt angle on the voltage applied to the actuator.

24 Claims, 7 Drawing Sheets

(56) References Cited

U.S. PATENT DOCUMENTS

| | | | |
|---|---|---|---|
| 5,907,436 A * | 5/1999 | Perry et al. | 359/576 |
| 6,215,222 B1 * | 4/2001 | Hoen | 310/309 |
| 6,747,785 B2 * | 6/2004 | Chen | G02B 26/0808 359/237 |
| 6,813,080 B2 | 11/2004 | Raguin et al. | 359/572 |
| 7,042,920 B2 | 5/2006 | Belikov et al. | 372/92 |
| 7,529,016 B1 | 5/2009 | Allen et al. | 359/290 |
| 7,826,501 B2 | 11/2010 | Stanley et al. | 372/20 |
| 7,903,318 B2 | 3/2011 | Moidu et al. | 359/291 |
| 8,000,359 B2 | 8/2011 | Sasaki et al. | 372/32 |
| 8,076,893 B2 | 12/2011 | Dong et al. | 318/686 |
| 8,134,277 B2 | 3/2012 | Moidu | 310/309 |
| 2003/0048036 A1 * | 3/2003 | Lemkin | 310/309 |
| 2003/0202264 A1 * | 10/2003 | Weber | B81B 7/04 359/877 |
| 2004/0096782 A1 * | 5/2004 | Trott | 430/321 |
| 2006/0284514 A1 | 12/2006 | Ko et al. | 310/309 |
| 2010/0110720 A1 * | 5/2010 | Cennini et al. | 362/554 |
| 2010/0296146 A1 | 11/2010 | Krastev et al. | 359/224.1 |

OTHER PUBLICATIONS

A. Q. Liu, X. M. Zhang, D. Y. Tang, and C. Lu, Tunable laser using micromachined grating with continuous wavelength tuning, Applied Physics Letters vol. 85, No. 17 Oct. 25, 2004, p. 3684.

A. Lohmann and R. R. A. Syms, External Cavity Laser With a Vertically Etched Silicon Blazed Grating, IEEE Photonics Technology Letters, vol. 15, No. 1, Jan. 2003, pp. 120.

Ming C. Wu, Olav Solgaard, and Joseph E. Ford, Optical MEMS for Lightwave Communication, Journal of Lightwave Technology, vol. 24, No. 12, Dec. 2006, p. 4433.

Maurizio Tormen, Yves-Alain Peter, Philippe Niedermann, Arno Hoogerwerf and Ross Stanley, Deformable MEMS grating for wide tunability and high operating speed, J. Opt. A: Pure Appl. Opt. 8 (2006) S337-S340.

Kiang et al., Surface-Micromachined Diffraction Gratings for Scanning Spectroscopic, Applications, IEEE International Conference on Solid-State Sensors and Actuators, Chicago, Jun. 16-19, 1997.

A. Hessel et al. "Bragg-angle blazing of diffraction gratings", JOSA vol. 65 No. 4 Apr. 1975, p. 380-384.

* cited by examiner

DIFFRACTIVE MEMS DEVICE

CROSS-REFERENCE TO RELATED APPLICATIONS

The present invention claims priority from U.S. Patent Application No. 61/585,362 filed Jan. 11, 2012, which is incorporated herein by reference.

TECHNICAL FIELD

The present invention relates to MEMS devices, and in particular to diffractive optical MEMS devices.

BACKGROUND OF THE INVENTION

Micro-electromechanical systems (MEMS) have found a variety of optical applications. MEMS can include tiltable micromirrors for redirecting optical beams, movable optical fiber tips for optical switching, movable micromirrors for tuning a resonant wavelength of an optical cavity, and the like.

Tiltable optical grating micromechanical structures have been used in the prior art to tune laser emission wavelength. Referring to FIG. 1, a grating-tunable semiconductor laser 10 includes a laser chip 12, a lens 14, and a microfabricated diffraction grating 16 mounted on a pivot 11 over a pair of electrodes 18a, 18b. When a voltage is applied between the diffraction grating 16 and either of the electrodes 18a or 18b, the diffraction grating 16 attracts to the respective electrodes 18a or 18b, tilting by a controllable angle about an axis defined by the pivot 11. The reflection wavelength of the diffraction grating 16 and, consequently, the emission wavelength of the laser 10 is tuned by applying voltage between one of the electrodes 18a or 18b and the diffraction grating 16. Tunable semiconductor lasers of this type have been described by Masaya et al. in Japanese patent 3129890A; Hiroyasu in Japanese patent application publication 2007-234916; Liu et al. in an article entitled "Tunable laser using micromachined grating with continuous wavelength tuning", *Appl. Phys. Lett.* 85, No. 17, pp. 3684-3686; Syms et al. in an article entitled "MOEMS Tuning Element for a Littrow External Cavity Laser", *J. of MEMS* v. 12, No. 6, p. 921-928; and other authors.

To improve diffraction efficiency, diffraction gratings of the prior art MEMS devices were "blazed", that is, grating grooves 17 were shaped to be approximately perpendicular to incoming optical beams 15. Liu and Sims blazed their gratings by Deep Reactive Ion Etching (DRIE) the required triangular profile of the grooves 17 into a side 19 of the diffraction grating 16. Due to a limitation on the maximum etching depth, only limited height gratings can be produced using a DRIE side etching technique. Furthermore, optical quality of side-etched grating surfaces is usually not as good as optical quality of surfaces disposed parallel to the substrate. Lower optical quality reduces achievable diffraction efficiency in blazed gratings manufactured by side etching.

Notably, high diffraction efficiencies can be achieved in binary diffraction gratings in "$-1^{st}$" diffractive order, even though the surfaces of the grooves and ridges of the grating may not be perpendicular to the incoming optical beam. By way of example, A. Hessel et al. in an article entitled "Bragg-angle blazing of diffraction gratings", *JOSA* Vol. 65 No 4 April 1975, p. 380-384, discussed binary gratings with high diffraction efficiency. Kiang et al. in an article entitled "Surface micromachined diffraction gratings for scanning spectroscopic applications", *Proc. Int. Conf Sol-State Sensors and Actuators*, June 1997, disclose a tunable binary diffraction grating manufactured in polycrystalline silicon using reactive ion etching (RIE) of a silicon dioxide layer; depositing polycrystalline silicon in the trenches in the silicon dioxide; and releasing the polycrystalline silicon grating structures. The grating of Kiang et al. is assembled into operating position of about 45 degrees to the substrate, and is coated with a layer of reflective metal. Detrimentally, assembly of out-of-plane tunable diffraction gratings of Kiang et al. requires many sophisticated process steps. Self-assembly of the diffraction grating into an out-of-plane position requires that the metal layer is deposited after the grating assembly step. Electrical shorts can occur when the metal deposition step occurs after the assembly step. Therefore, the metal layer cannot be made thick, which may limit maximum achievable reflectivity and/or diffraction efficiency. Furthermore, large out-of-plane standing structures supported by relatively thin and flexible hinges are sensitive to shock and vibration.

Grating reflection wavelength can also be tuned by providing a stretchable optical grating structure. In stretchable gratings, the reflection wavelength is varied when the groove spacing changes upon stretching. By way of example, Stanley et al. in U.S. Pat. No. 7,826,501; and Tormen et al. in an article entitled "Deformable MEMS grating for wide tunability and high operating speed", *J. Opt. A: Pure Appl. Opt.* 8 (2006) S337-S340, disclose microfabricated blazed diffraction gratings having an array of parallel elongated reflective surfaces disposed on a stretchable support. When the support is stretched, the groove spacing is changed, effectively tuning the reflected wavelength. Detrimentally, stretchable diffraction gratings are not as reliable, and the optical quality of stretchable gratings is generally lower than the optical quality of solid gratings.

Another type of wavelength tunable diffractive structures includes a phased array of individually tiltable or movable mirrors. For example, Belikov et al. in U.S. Pat. No. 7,042,920 disclose a tunable laser having a phased array grating including individually tiltable or translatable micromirrors allowing one to vary pitch and/or effective angle of the diffractive structure. Detrimentally, the phased array of Belikov et al. requires a complex controller/driver, and is rather difficult to manufacture.

The prior art is lacking an easily tunable, highly manufacturable and reliable diffractive MEMS device capable of attaining high optical efficiency over the tuning range. Accordingly, it is a goal of the invention to provide such a tunable diffractive MEMS device.

SUMMARY OF THE INVENTION

A diffractive MEMS device of the invention has an in-plane binary reflective diffraction pattern formed in a top surface of a tiltable platform. The diffraction pattern is binary, that is, it includes rectangular or trapezoidal ridges and valleys, or grooves, of a same depth. Herein, the term "in-plane" means parallel to the substrate during manufacture. Binary diffraction patterns are relatively easy to form in-plane and coat with a layer of metal using standard and well established MEMS manufacturing techniques. MEMS manufacturing compatible, highly efficient, in-plane diffractive patterns can be supported by a pair of strong torsional hinges, which improve stability of the diffractive MEMS device to shock and vibration. The platform having the diffractive pattern is tiltable by an electrostatic actuator. In a preferred embodiment, the electrostatic actuator includes at least one side electrode for linearization of dependence of tilt angle on the voltage applied to the electrostatic actuator. In this way, reliable and optically efficient tiltable MEMS diffraction gratings can be manufactured with high yield.

In accordance with the invention there is provided a diffractive MEMS device comprising:

a substrate;

a platform hingedly supported over the substrate and tiltable about a first axis;

an electrostatic actuator comprising a stator and a rotor for tilting the platform about the first axis when a first control voltage is applied between the stator and the rotor;

wherein the platform is substantially parallel to the substrate when no voltage is applied between the stator and the rotor;

wherein the platform has a binary diffractive surface relief pattern therein and a conforming reflective metal coating disposed over the binary surface relief pattern; and wherein the binary surface relief pattern includes a plurality of ridges having sidewalls and separated by trenches, the ridges having rectangular or trapezoidal cross-sections.

In a preferred embodiment, the stator includes a first stator side electrode extending upwardly from the substrate adjacent to and along a first edge of the platform, whereby in operation, a dependence of an angle of tilt of the platform about the first axis on the first control voltage becomes more linear.

In accordance with another aspect of the invention there is further provided a tunable semiconductor laser comprising:

a semiconductor chip for providing optical gain at a lasing wavelength; and the diffractive MEMS device as defined above, optically coupled to the semiconductor chip, for providing a wavelength selective optical feedback for tuning the lasing wavelength.

In accordance yet with another aspect of the invention there is further provided a method of manufacturing a MEMS diffractive device, comprising:

(a) providing a semiconductor wafer having a platform disposed thereon or therein;

(b) etching a binary diffractive surface relief pattern into the platform;

(c) coating the binary diffractive surface relief pattern of step (b) with a conforming metal layer;

(d) suspending the platform over the substrate for tilting the platform about a first axis;

wherein the binary diffractive surface relief pattern includes a plurality of ridges separated by trenches, the ridges and the trenches having rectangular or trapezoidal cross-sections.

BRIEF DESCRIPTION OF THE DRAWINGS

Exemplary embodiments will now be described in conjunction with the drawings, in which.

DETAILED DESCRIPTION OF THE INVENTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art.

Figure 2:
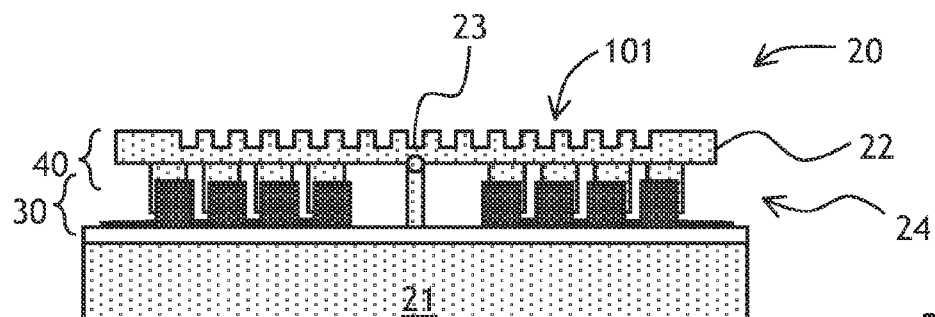
FIG. 2 is a side cross-sectional view of a diffractive MEMS device of the invention.
Figure 3:
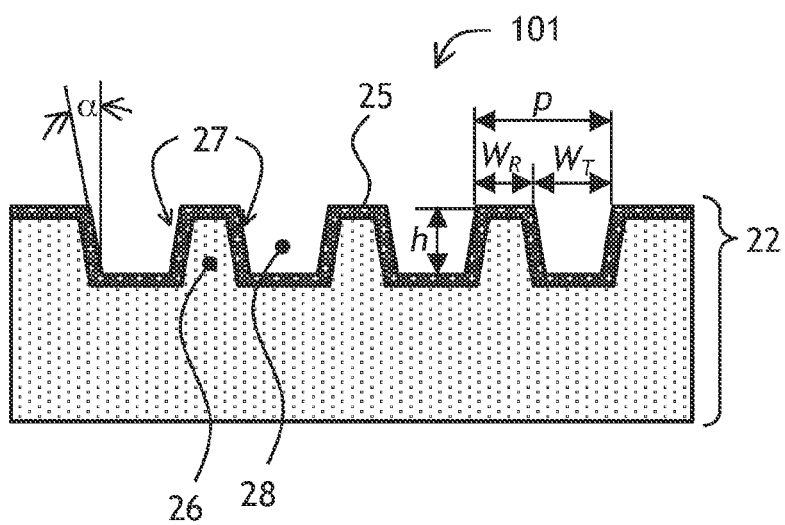
FIG. 3 is a side cross-sectional view of a binary diffractive surface relief diffractive pattern of the diffractive MEMS device of FIG. 2.
Figure 4:
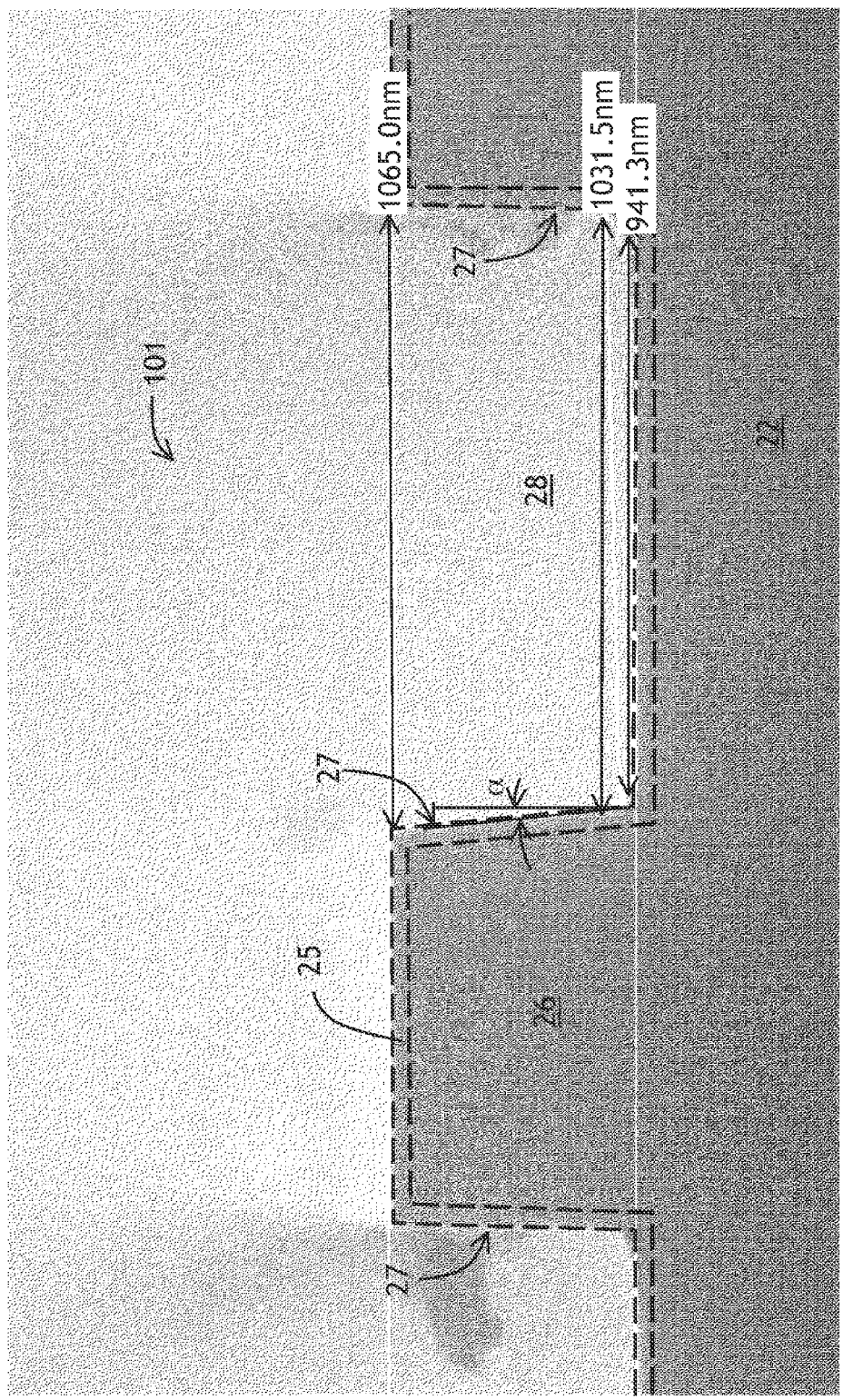
FIG. 4 is a microphotograph of a cross section of the binary diffractive surface-relief pattern of FIG. 3.

Referring to FIGS. 2, 3, and 4, a MEMS device 20 includes a substrate 21, a platform 22 hingedly supported over the substrate 21 and tiltable about a tilt axis 23, and an electrostatic actuator 24 including a stator 30 and a rotor 40 for tilting the platform 22 about the tilt axis 23 when a control voltage $V_1$ is applied between the stator 30 and a rotor 40. The platform 22 has a binary diffractive surface relief pattern 101 therein and a conforming reflective metal coating 25 disposed over the binary diffractive surface relief pattern 101. In the absence of the control voltage $V_1$, the platform 22 is disposed parallel to the substrate 21. When the control voltage $V_1$ is applied, the platform 22 tilts about the tilt axis 23. The parallelism of the platform 22 to the substrate 21, or so called "in-plane" disposition of the platform 22, considerably simplifies manufacturing of the binary surface relief pattern 101, allowing use of well established MEMS etching and metal deposition processes.

Referring specifically to FIGS. 2 and 3, the binary diffractive surface relief pattern 101 includes a plurality of ridges 26 having sidewalls 27. The ridges 26 are separated by trenches 28. As seen in FIG. 2, the ridges 26 have rectangular or trapezoidal cross-sections. Referring to FIG. 3, the ridges 26 are defined by height h and top width $w_R$, and the trenches 28 are defined by a trench top width $w_T$. In a preferred embodiment, the binary surface relief pattern 101 is a diffraction grating having a plurality of straight ridges 26 separated by straight trenches 27. For a diffraction grating, one can define a pitch parameter p as a sum of the ridge top width $w_R$ and the trench top width $w_T$. By way of example, in FIG. 4 the trench top width $w_T$ is 1065.0 nm. In one embodiment, the sidewalls 27 of the ridges 26 have a slant angle $\alpha$ of at least two degrees away from perpendicular to the platform 22. The trench bottom widths shown in FIG. 4 are between 941.3 and 1031.5 nm.

Figure 1:
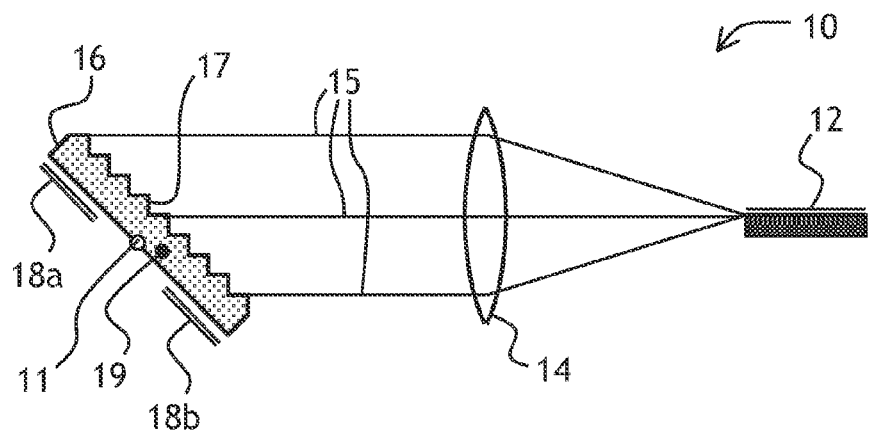
FIG. 1 is a side elevational view of a prior-art tunable semiconductor laser having a tunable blazed MEMS grating as a wavelength-selective reflector.

The pitch parameter p, the ridge height h, the trench top width $w_T$, and the slant angle $\alpha$ are selected based on two criteria which are to be fulfilled simultaneously. First, the diffraction efficiency of the diffraction grating 101 needs to be maximized; and second, the parameters have to allow high MEMS manufacturing yields. To achieve a >90% diffraction efficiency in a commonly used Littrow geometry shown in FIG. 1, the ridge height h, the ridge top width $w_R$, the trench top width $w_T$, and the slant angle α are optimized using rigorous electromagnetic diffraction simulations. The grating pitch parameter p is typically selected to be between 75% and 125% of the lasing wavelength, for example 1550 nm for telecommunication wavelength C band of 1525 to 1570 nm, such that only the $0^{th}$ and $-1^{st}$ orders of diffraction are propagating. To ensure high manufacturability, the profile of the ridges 26 and/or trenches 28 must be compatible with high volume Complementary Metal-Oxide Semiconductor (CMOS) MEMS type fabrication processes. Certain slant angle α ranges, for example, can be a natural result of reactive ion etching process. These slant angle α ranges can be given preference during numerical optimization. The numerical optimization includes adjusting the ridge height h, the ridge top width $w_R$, the trench top width $w_T$, and the slant angle α and calculating resulting diffraction efficiency, to achieve high diffraction efficiency at desired polarizations. Large values of trench width $w_T$ were preferred during simulation, because large trench widths $w_T$ allow coating of the sidewalls 27 to a proper thickness of at least 20 nm. The importance of the sidewalls coating will be explained further below.

Tables 1a, 1b, and 1c summarize simulation results for TE, TM, and low polarization dependent loss (PDL) TE+TM polarizations, respectively, for the pitch parameter p=1550 nm.

Table 1a

Grating simulations for TE polarization

| Parameter | Low Value | Target Value | High Value | Tolerance (+/−) |
|---|---|---|---|---|
| $w_T$ | 0.95 um | 1.05 um | 1.15 um | 0.1 um |
| h | 0.60 um | 0.65 um | 0.70 um | 0.05 um |
| α | −2.5° | 2.5° | 7.5° | 5° |

TABLE 1b

Grating simulations for TM polarization

| Parameter | Low Value | Target Value | High Value | Tolerance (+/−) |
|---|---|---|---|---|
| $w_T$ | 0.60 um | 0.70 um | 0.80 um | 0.1 um |
| h | 0.30 um | 0.35 um | 0.40 um | 0.05 um |
| α | 0° | 5° | 10° | 5° |

TABLE 1c

Grating simulations for low PDL (TE + TM polarizations)

| Parameter | Low Value | Target Value | High Value | Tolerance (+/−) |
|---|---|---|---|---|
| $w_T$ | 0.75 um | 0.85 um | 0.95 um | 0.1 um |
| h | 1.15 um | 1.20 um | 1.25 um | 0.05 um |
| α | 0° | 5° | 10° | 5° |

The numerical simulations indicate that, to achieve the diffraction efficiency of the binary diffraction grating 101 for TE polarized light at 1.55+−0.05 micrometers of at least 85% at the pitch parameter p of 1.55+−0.1 micrometers, the trench top width $w_T$ should be between 0.9 and 1.2 micrometers; the ridge height h should be between 0.5 and 0.8 micrometers; and the slant angle α should be less than 8 degrees. To achieve the diffraction efficiency of the binary diffraction grating 101 for TM polarized light at 1.55+−0.05 micrometers of at least 85% at the pitch parameter p of 1.55+−0.1 micrometers, the trench top width $w_T$ should be between 0.5 and 0.9 microns; the ridge height h should be between 0.2 and 0.5 microns; and the slant angle α should be less than 12 degrees. To achieve the diffraction efficiencies of the binary diffraction grating 101 for TE or TM polarized light of within 10% of each other, at the pitch parameter p of 1.55+−0.1 micrometers, the trench top width $w_T$ should be between 0.7 and 1.0 microns; the ridge height h should be between 1.1 and 1.3 microns; and the slant angle α should be less than 12 degrees.

In a preferred embodiment, the conforming reflective metal layer 25 is disposed on the sidewalls 27 of the ridges 26 and in the trenches between the ridges 26. The thickness of the conforming reflective metal layer 25 on the sidewalls is at least 20 nm. It has been found that coating of sidewalls to at least 20 nm thickness, preferably to 40 nm thickness, and most preferably to 60 nm thickness, results in a dramatic improvement of overall diffraction efficiency. The platform 22 is preferably at least 10 micrometers thick, to ensure good mechanical rigidity and optical quality of the binary diffractive surface relief pattern 101.

Figure 5:
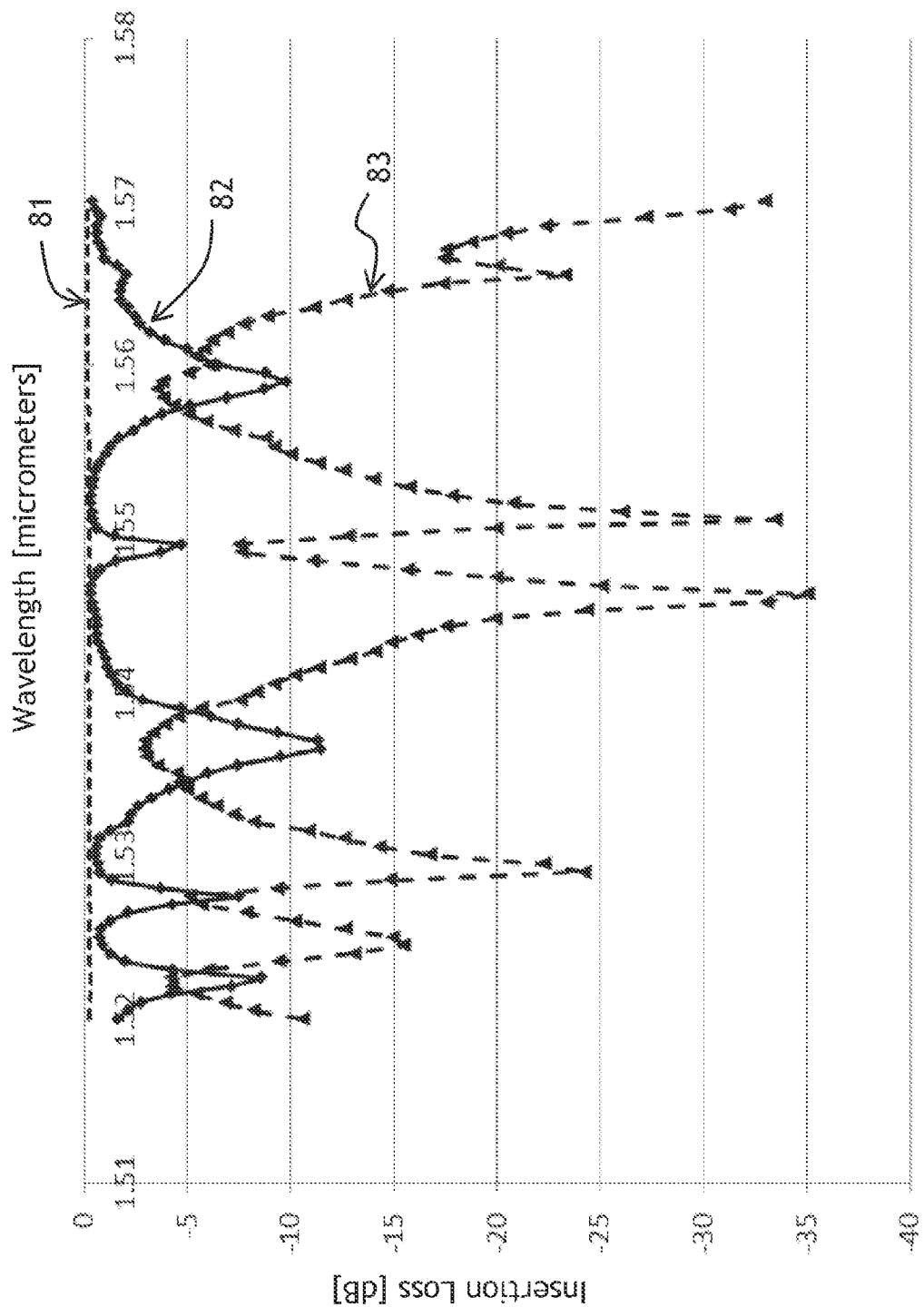
FIG. 5 is a calculated wavelength dependence of diffraction efficiencies of a binary diffraction grating with uncoated and coated sidewalls.
Figure 6:
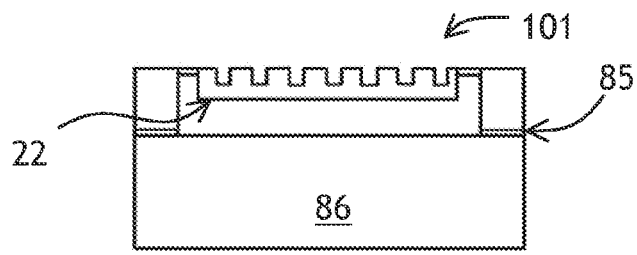
FIG. 6 is a side cross-sectional view of a suspended silicon platform used in the simulation of FIG. 5.

Referring to FIG. 5 with further reference to FIG. 6, the diffraction efficiency was calculated at coated and uncoated sidewalls 27. The thickness of the silicon platform 22 was 10 micrometers, the thickness of a $SiO_2$ layer 85 was 3 micrometers, and the thickness of the silicon substrate 86 was 600 micrometers. A dashed line 81 denotes a calculated wavelength dependence of the diffraction efficiency at 60 nm thickness of the metal overcoat 25 on the sidewalls 27. The diffraction efficiency approaches 100%. A solid-rhombic line 82 and a dash-triangle line 83 denote a calculated wavelength dependence of the diffraction efficiency into $-1^{st}$ and $0^{th}$ diffraction orders, respectively, at the uncoated sidewalls 27. The tops of the ridges 26 were coated. One can see that uncoated sidewalls reduce the diffraction efficiency dramatically. The reduction of the diffraction efficiency is believed to be due to interference of light waves that leaked through the sidewalls within the platform 22. Due to small thickness of the platform 22 and a good optical quality of its lower surface, the leaked light waves bounce within the platform 22, interfering with the diffracted waves and causing the reduction of the overall diffraction efficiency. This effect does not normally take place at large thicknesses of the diffraction grating substrates, because the leaked light can be scattered away in thick substrates of non-MEMS diffraction gratings.

In a preferred embodiment, the platform 22 is made of crystalline silicon. Also in a preferred embodiment, the conforming reflective metal layer 25 comprises gold or aluminum. Advantageously, the binary surface relief pattern 101 of the platform 22 is preferably photoresist free. CMOS MEMS processes do not normally require photoresist to remain on the silicon platform 22. Absence of photoresist results in the more stable diffractive pattern 101. When the platform 22 does not include a photoresist, it is completely inorganic, improving temperature and humidity resistance to delamination of the grating ridges from the platform. Furthermore, a completely inorganic grating is compatible with standard MEMS processing steps allowing easier process integration.

Although the binary surface relief pattern 101 shown in FIGS. 2 to 4 is a diffraction grating, other diffractive elements or structures can be used. By way of a non-limiting example, the binary surface relief pattern 101 can include an aberration-correcting diffractive optical element, and/or a diffractive optical element having a magnifying or demagnifying power, like a lens or a concave/convex mirror. These elements can be combined with a diffraction grating to obtain a flat binary diffractive equivalent of a concave diffraction grating.

Turning now to FIGS. 7A and 7B, 8, and 9, a diffractive MEMS device 70 includes the platform 22 supported by a pair of torsional hinges 60. The diffractive MEMS device 70 is a variant of the diffractive MEMS device 20 of FIG. 2. In FIGS. 7A and 7B, FIG. 8, and FIG. 9, the actuator 24 includes a first stator comb 31 extending from the substrate 21 towards the platform 22, and a first rotor comb 41 extending from the platform 22 towards the substrate 21. The first rotor comb 41 is interdigitated with the first stator comb 31. When the voltage $V_1$ is applied between the first stator comb 31 and the first rotor comb 41, the platform tilts in a first direction of tilt 71. The stator 30 and the rotor 40 are symmetrical. A second stator comb 32 extends from the substrate 21 towards the platform 22, and a second rotor comb 42 extends from the platform 22 towards the substrate 21. The second rotor comb 42 is interdigitated with the second stator comb 32. When the voltage $V_2$ is applied between the second stator comb 32 and the second rotor comb 42, the platform tilts in a second direction of tilt 72 opposite to the first direction of tilt 71. This allows one to double the maximum tilt angle of the platform 22.

The stator 30 further includes four stator side electrodes 51 to 54 extending upwardly from the substrate 21 adjacent to and along four edges of the rectangular platform 22. Four flanges 61 to 64 of the platform 22 extend laterally and surround the respective first to fourth stator side electrodes 51 to 54. Fifth to eighth stator side electrodes 55 to 58 extend from the substrate 21 on opposite sides of the platform 22, so that the first flange 61 is at least partially disposed between the first 51 and fifth 55 side electrodes, the second flange 62 is at least partially disposed between the second 52 and sixth 56 side electrodes, and so on. In operation, the left-side stator side electrodes 51, 52, 55, and 56 are energized together with the first stator comb 31; and the right-side stator electrodes 53, 54, 57, and 58 are accordingly energized together with the second stator comb 32.

Figure 7A:
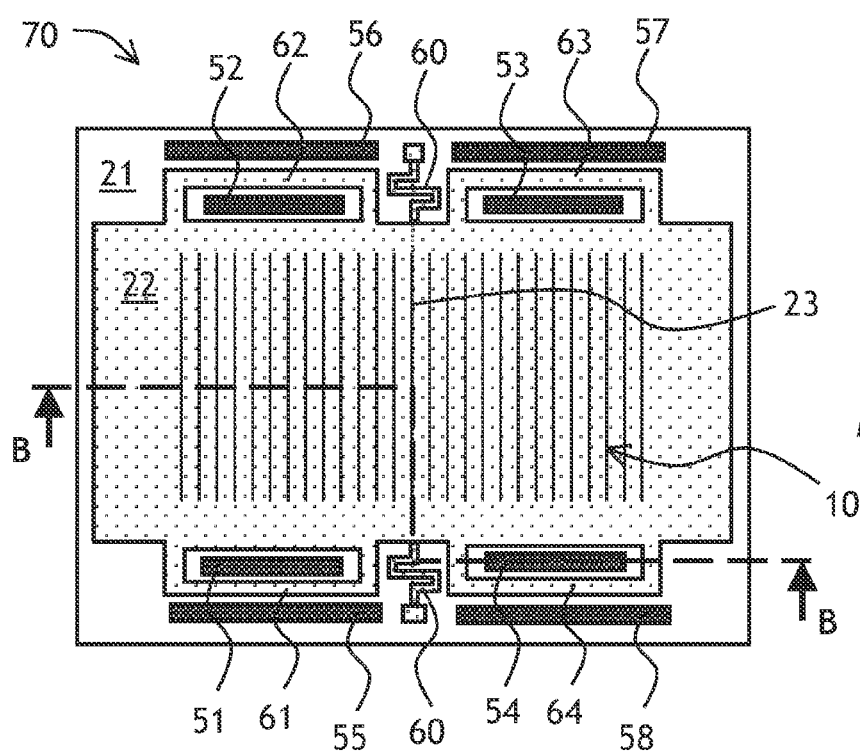
FIG. 7A is a top view of a diffractive MEMS device of the invention having side electrodes.
Figure 7B:
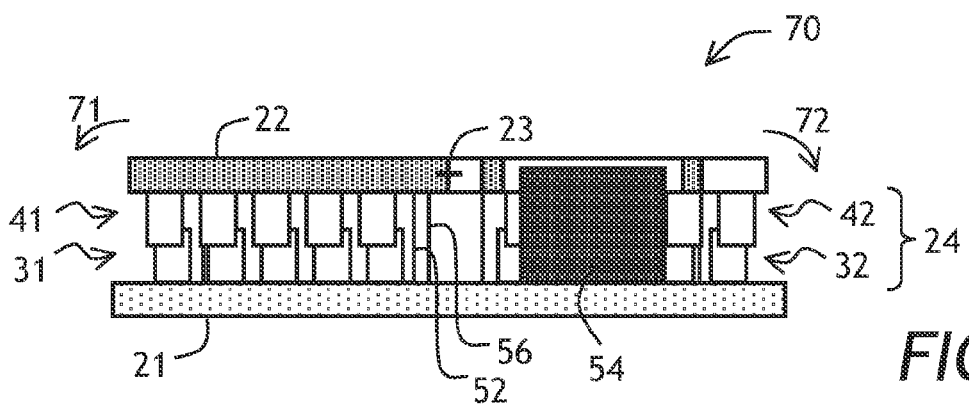
FIG. 7B is a side cross-sectional view taken along lines B-B of FIG. 7A.
Figure 8:
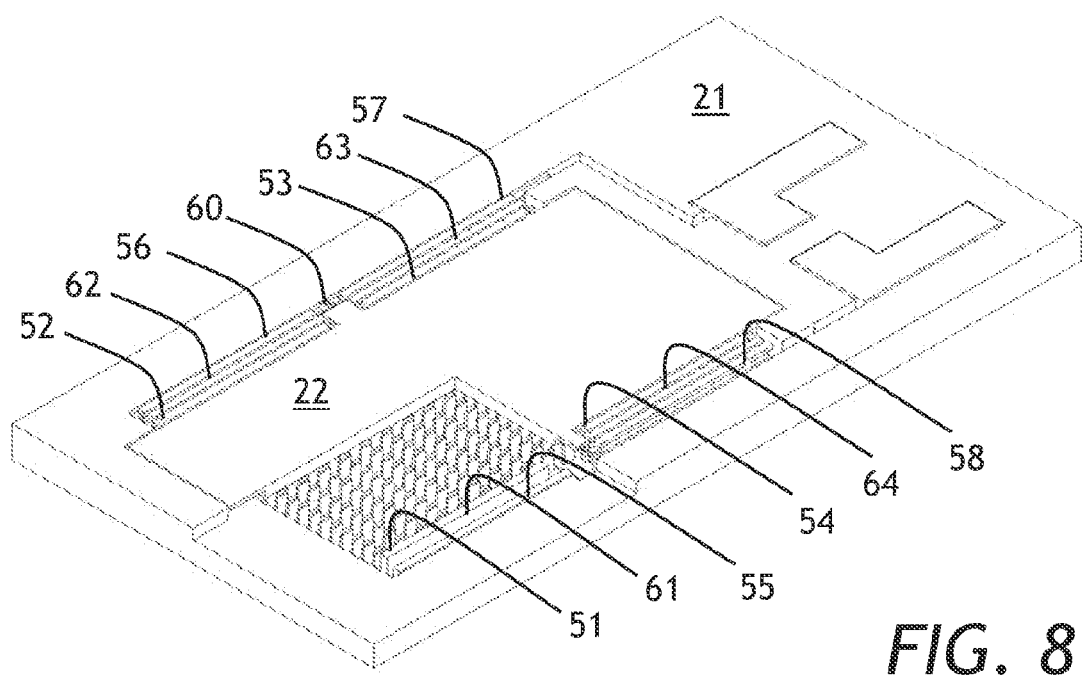
FIG. 8 is an isometric view of a variant of the MEMS device of FIGS. 7A and 7B.
Figure 9:
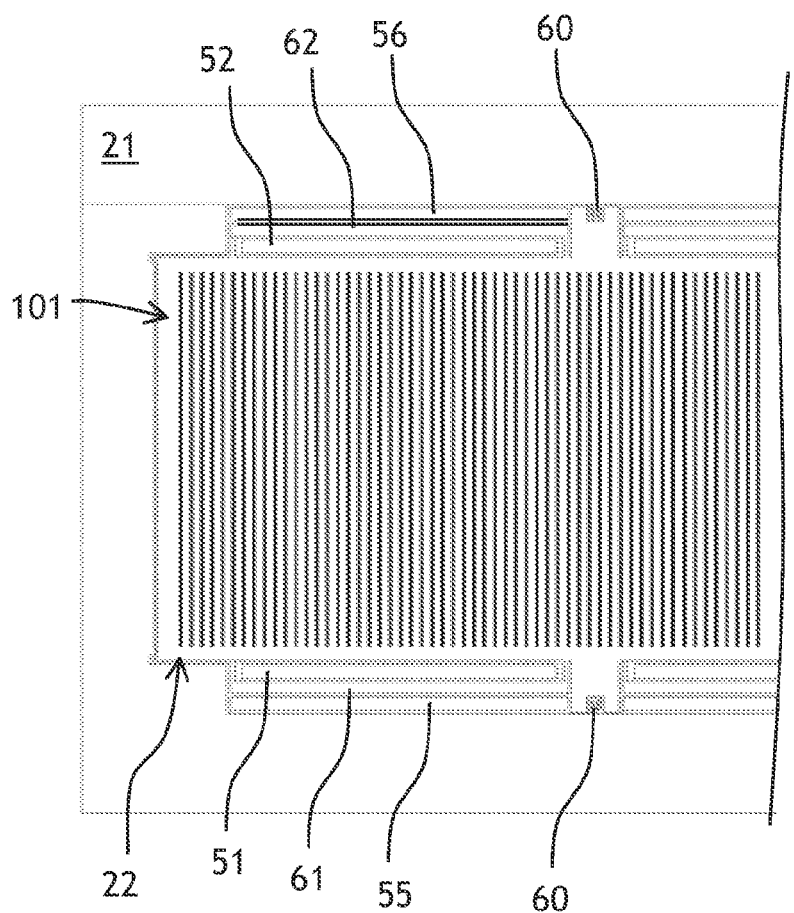
FIG. 9 is a top view of the MEMS device of FIG. 8.
Figure 10A:
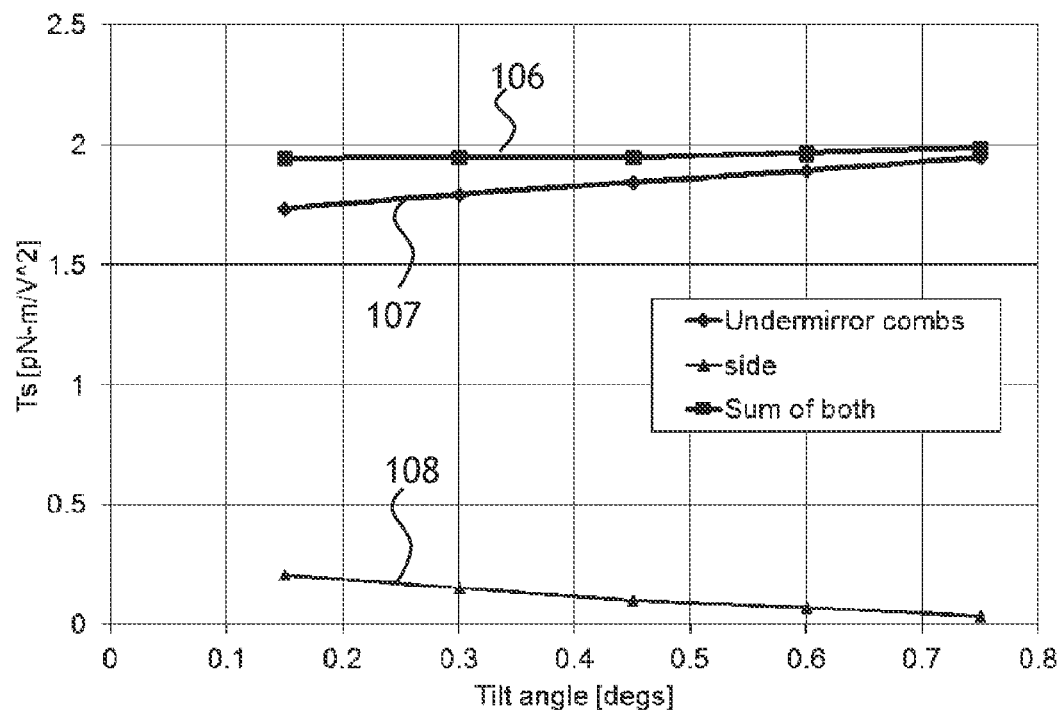
FIGS. 10A and 10B are plots of torque and tilt angle vs. voltage, respectively, of the MEMS device of FIGS. 8 and 9.
Figure 10B:
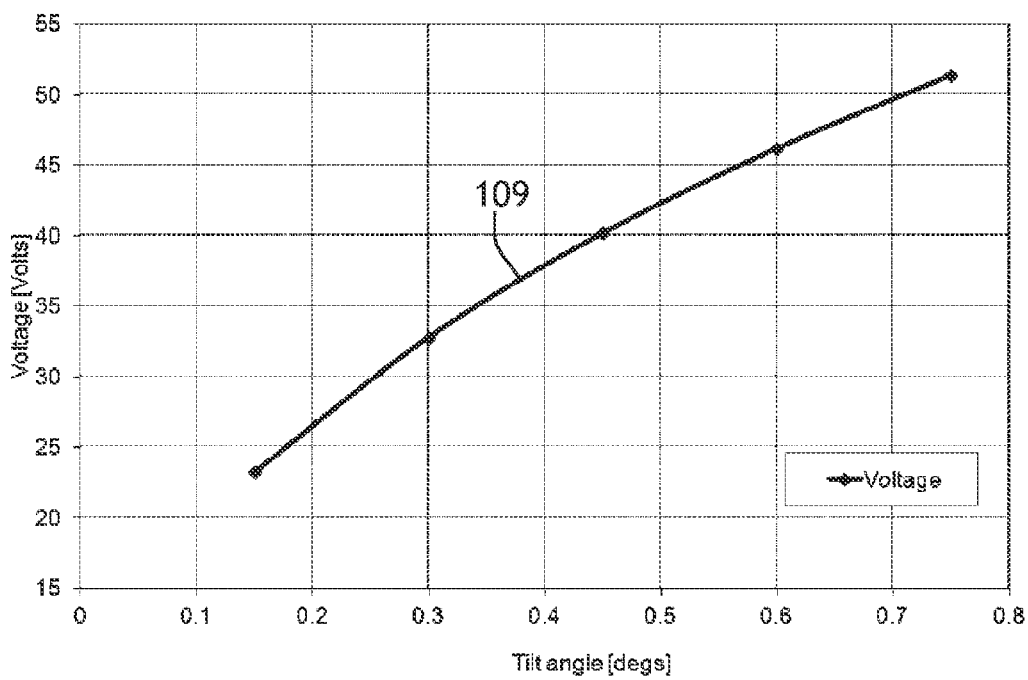

Advantageously, the side electrode structure of FIGS. 7A and 7B allows one to make a dependence of an angle of tilt of the platform 22 about the tilt axis 23 on the control voltages $V_1$ and/or $V_2$ more linear. Turning to FIGS. 10A and 10B, a specific torque slope in $pN*m/V^2$ is plotted as a function of the tilt angle in degrees. A slope 106 generated by the first stator comb 31 and the first rotor comb 41 increases with the tilt angle, which is typical for comb-type electrostatic actuators. A slope 107 generated by the left-side stator electrodes 51, 52, 55, and 56, in combination with the left-side flanges 61 and 62 decreases with the tilt angle. Taken together, the slopes 106 and 107 tend to counterbalance each other. A summary slope 108 changes very insignificantly with the tilt angle. As a result, a dependence 109 of the control voltage on the tilt angle, seen in FIG. 10B, becomes more linear.

Preferably, the first 51 and second 52 stator side electrodes extend to at least 50% to 150% of a distance between the substrate 21 and the platform 22 when no voltage is applied between the stator 30 and the rotor 40, and more preferably, the first 51 and second 52 stator side electrodes extend to at least 75% to 125% of that distance when no voltage is applied. The latter distance range generally provides a more linear tilt-voltage dependence. Also, the number of the side stator electrodes 51 to 58 can vary. For single-sided actuators, only one side electrode 51, placed near an edge of the platform 22, can provide some linearization of the tilt-voltage dependence. The number of the side electrodes 51 to 58 can be, for example, two, four, eight, and more. Furthermore, the flanges 61 to 64 are optional, although the presence of the flanges does assist linearization of the tilt-voltage dependence. The stator combs 31, 32 and the rotor combs 41, 42 can be two-dimensional rows of combs, seen in FIG. 8, one-dimensional rows of combs, or other types of electrostatic actuators for which the torque has a tendency to increase with the tilt angle.

Figure 11:
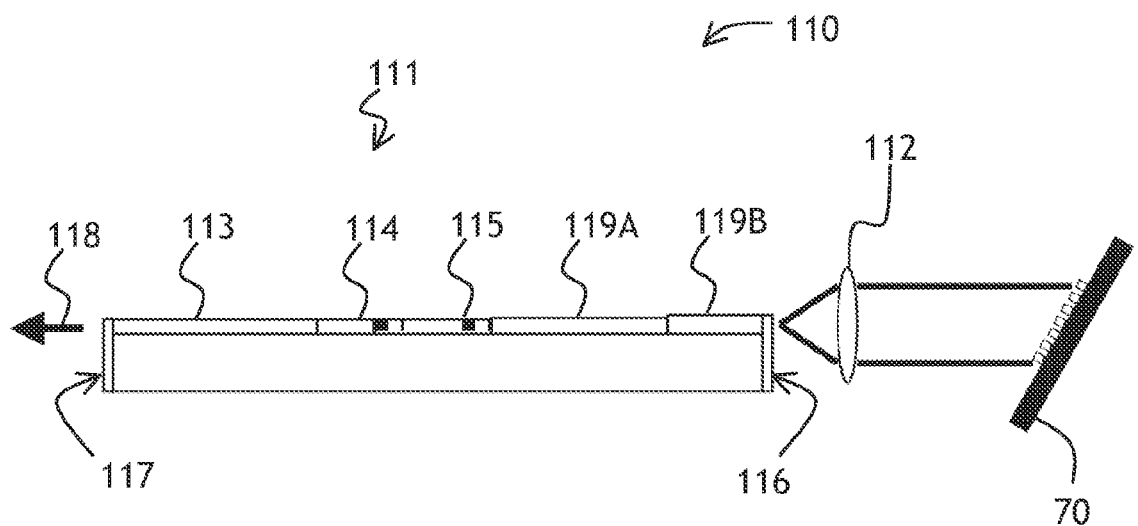
FIG. 11 is a side elevational view of a semiconductor laser having the MEMS device of FIGS. 7A, B to FIG. 9 as a wavelength-selective reflector.

Turning now to FIG. 11, a tunable semiconductor laser 110 includes a semiconductor laser chip 111 for providing optical gain at a lasing wavelength $\lambda$; and the MEMS device 70 optically coupled to the semiconductor laser chip 111 through a lens 112. In operation, the MEMS device 70 provides a wavelength selective optical feedback for tuning the lasing wavelength $\lambda$. The semiconductor laser chip 111 includes in sequence a Mach Zehnder modulator 113, a semiconductor optical amplifier (SOA) 114, a frequency-modulated (FM) burst sampled grating 115, a laser gain section 119A, and a phase section 119B, which is tuned synchronously with the MEMS device 70 for a mode hopping free performance. An anti-reflection (AR) coatings 116 and a translucent coating 117 are applied to both facets of the laser chip 111. An output optical beam 118 exits on the left of the semiconductor laser chip 111.

In a preferred embodiment, the grating pitch parameter p of the binary diffractive pattern 101 is between 75% and 125% of the lasing wavelength $\lambda$. In this range of the pitch parameter p, only $0^{th}$ and minus $1^{st}$ diffraction orders are non-evanescent, allowing very high diffraction efficiencies, approaching 100%, using manufacturable binary diffractive patterns.

One of the advantages of MEMS technology is "array-ability", that is, a capability to provide arrays of identical MEMS devices 20 or 70 on the common substrate 21. Arrays of optical MEMS devices enable parallel processing of arrays of optical beams. For example, when the MEMS device 20 or 70 is used in a spectroscopic application, an array of the MEMS devices 20 or 70 can be used in an arrayed optical spectrometer capable of simultaneous spectroscopic analysis of multiple optical beams and/or multiple samples. In a laser application, an array of individually tunable semiconductor lasers 110 can be constructed, which can be very beneficial for optical communications applications.

Figure 12:
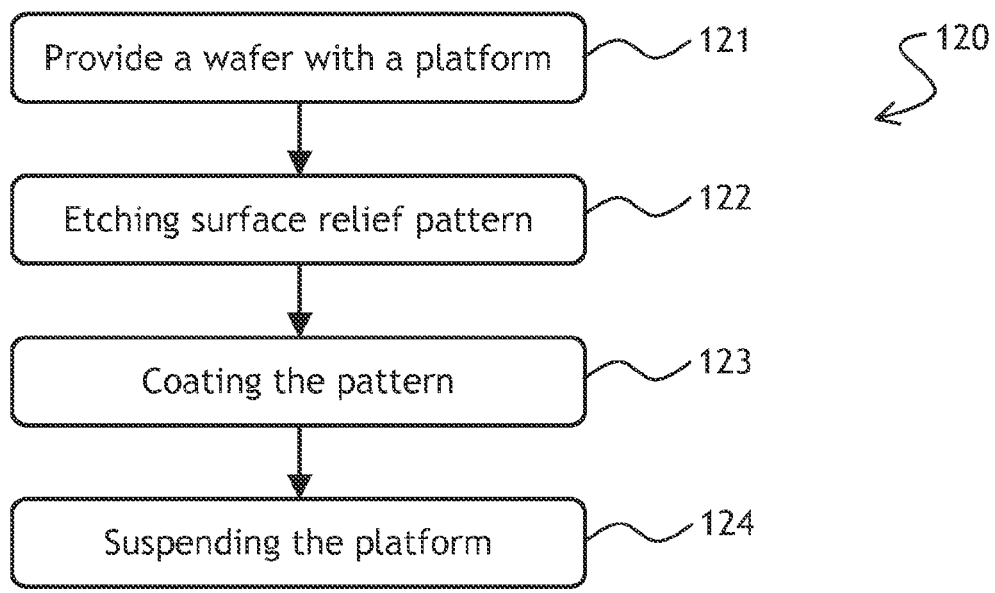
FIG. 12 is a block diagram of a method of manufacturing of a diffractive MEMS device of FIGS. 2, 6, 7A-7B, 8, and 9.

Turning to FIG. 12, a method 120 of manufacturing of the diffractive MEMS device 20 or 70 includes a step 121 of providing a semiconductor wafer having the platform 22 disposed thereon or therein. In a step 122, the binary diffractive surface relief pattern 101 is etched into the platform 22, preferably by reactive ion etching. In a step 123, the binary diffractive surface relief pattern 101 is coated with a conforming metal layer, preferably gold or aluminum. Finally, in a step 124, the platform 22 is photolithographically defined and etched to suspend the platform 22 over the substrate 21 for tilting about the tilt axis 23.

In the coating step 123, the sidewalls 27 are preferably coated to a thickness of at least 20 nm, and more preferably to a thickness of at least 60 nm, to prevent light leaking into the platform 22, as explained above. Also, the step 124 of suspending the platform 22 over the substrate 21 typically includes photolithographic definition, etching, and release of the platform 22, all of this occurring after the coating step 123. Thus, the coating of the binary diffractive pattern 101 is performed before the definition and release step 124. This allows one to avoid electrical shorts even for a more thick and uniform coating, for further improvement of the diffraction efficiency of the binary diffractive pattern 101.

Many advantages of the invention stem from the fact that highly efficient binary diffraction gratings can be manufactured using standard MEMS processes, in particular in-plane gratings on a single-crystal silicon platform. This enables in-plane binary diffraction gratings to be suspended over a planar substrate for tilting using MEMS electrostatic actuators. The synergy of linearized MEMS actuators, having almost linear voltage-tilt angle characteristic, and binary diffraction gratings, having diffraction efficiencies typically over 90%, enables efficient, reliable, and well controlled tiltable diffractive elements to be manufactured with high yield.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. A diffractive MEMS device comprising:
   a substrate;
   a platform hingedly supported over the substrate and tiltable about a first axis;
   an electrostatic actuator comprising a stator and a rotor for tilting the platform about the first axis when a first control voltage is applied between the stator and the rotor, wherein
   the stator comprises a first stator side electrode extending into a horizontal plane of the platform, upwardly from the substrate, and adjacent to and along a first edge of the platform for an electrostatic interaction with the platform, and
   the stator and the rotor are located above the substrate, and
   the platform is substantially parallel to the substrate when no voltage is applied between the stator and the rotor,
   the platform comprises a binary diffractive surface relief pattern, comprising a binary diffraction grating therein, and a conforming reflective metal layer disposed over the binary diffractive surface relief pattern, and
   the binary diffractive surface relief pattern comprises a plurality of ridges comprising sidewalls and separated by trenches,
   the ridges having rectangular or trapezoidal cross-sections,
   the ridges have a height and top width,
   the trenches have a trench top width,
   the ridge height and the trench top widths add up to a pitch parameter.

2. The diffractive MEMS device of claim 1, wherein the sidewalls of the ridges have a slant angle of at least two degrees away from perpendicular with respect to the platform.

3. The diffractive MEMS device of claim 1, wherein the conforming reflective metal layer is disposed on the sidewalls of the ridges and in the trenches there between.

4. The diffractive MEMS device of claim 1, wherein the platform comprises single-crystal silicon.

5. The diffractive MEMS device of claim 1, wherein the platform is at least 10 micrometers thick.

6. The diffractive MEMS device of claim 1, wherein the conforming reflective metal layer comprises gold or aluminum.

7. The diffractive MEMS device of claim 1, wherein the binary diffractive surface relief pattern is substantially photoresist free.

8. The diffractive MEMS device of claim 1, wherein a thickness of the conforming reflective metal layer on the sidewalls is at least 20 nm.

9. The diffractive MEMS device of claim 1, wherein
   the trench top width is between 0.9 and 1.2 micrometers,
   a height of the ridges is between 0.5 and 0.8 micrometers,
   a slant angle is less than 8 degrees, and
   the pitch parameter is 1.55+−0.1 micrometers, whereby a diffraction efficiency of the binary diffraction grating for TE polarized light at 1.55+−0.05 micrometers is at least 85%.

10. The diffractive MEMS device of claim 1, wherein
    the trench top width is between 0.5 and 0.9 micrometers,
    a height of the ridges is between 0.2 and 0.5 micrometers,
    a slant angle is less than 12 degrees, and
    the pitch parameter is 1.55+−0.1 micrometers, whereby a diffraction efficiency of the binary diffraction grating for TM polarized light at 1.55+−0.05 micrometers is at least 85%.

11. The diffractive MEMS device of claim 1, wherein
    the trench top width is between 0.7 and 1.0 micrometers,
    a height of the ridges is between 1.1 and 1.3 micrometers,
    a slant angle is less than 12 degrees, and
    the pitch parameter is 1.55+−0.1 micrometers, whereby diffraction efficiencies of the binary diffraction grating for TE or TM polarized light are within 10% of each other.

12. The diffractive MEMS device of claim 1, wherein the binary diffractive surface relief pattern further comprises a wavefront-correcting diffractive optical element and/or a diffractive optical element having a magnifying or demagnifying power.

13. The diffractive MEMS device of claim 1, wherein
    the stator further comprises a second stator side electrode extending upwardly from the substrate adjacent to and along a second edge of the platform for an electrostatic interaction therewith, and
    the first and second stator side electrodes extend to at least 75% to 125% of a distance between the substrate and the platform when no voltage is applied between the stator and the rotor.

14. The diffractive MEMS device of claim 13, wherein
    the stator further comprises a first stator comb extending from the substrate towards the platform,
    the rotor comprises a first rotor comb extending from the platform towards the substrate,
    the first rotor comb is interdigitated with the first stator comb, and
    the platform comprises first and second flanges extending laterally therefrom and surrounding the first and second stator side electrodes, respectively.

15. The diffractive MEMS device of claim 14, wherein the stator further comprises third and fourth stator side electrodes extending from the substrate on opposite sides of the platform for an electrostatic interaction therewith, so that the first flange is at least partially disposed between the first and third stator side electrodes, and the second flange is at least partially disposed between the second and fourth stator side electrodes.

16. The diffractive MEMS device of claim 15, wherein
the stator further comprises a second stator comb extending from the substrate towards the platform,
the rotor further comprises a second rotor comb extending from the platform towards the substrate,
the second rotor comb is interdigitated with the second stator comb and is configured to tilt the platform about the first axis in a second direction of tilt opposite to a first direction, when a second control voltage is applied between the platform and the second stator comb,
the stator further comprises fifth and sixth stator side electrodes extending upwardly from the substrate on opposite sides of the platform for an electrostatic interaction therewith,
the fifth and sixth stator side electrodes extend to at least 75% to 125% of a distance between the substrate and the platform when no voltage is applied between the stator and the rotor, and
the platform comprises flanges extending laterally therefrom and surrounding the fifth and sixth stator side electrodes, respectively.

17. An array of the diffractive MEMS devices of claim 1 disposed on the substrate.

18. A tunable semiconductor laser comprising:
a semiconductor chip for providing optical gain at a lasing wavelength; and
the diffractive MEMS device of claim 1 optically coupled to the semiconductor chip, for providing a wavelength selective optical feedback for tuning the lasing wavelength.

19. The tunable semiconductor laser of claim 18, wherein the pitch parameter is between 75% and 125% of the lasing wavelength.

20. The diffractive MEMS device of claim 1, wherein the platform further includes a flange that surrounds at least some of the first stator side electrode.

21. A method of manufacturing a diffractive MEMS device, the method comprising:
providing a semiconductor wafer comprising a platform;
etching, after providing the semiconductor wafer, a binary diffractive surface relief pattern into the platform;
coating, after etching the binary diffractive surface relief pattern, the binary diffractive surface relief pattern with a conforming metal layer; and
suspending, after coating the binary diffractive surface relief pattern with a conforming metal, the platform over a substrate for tilting the platform about a first axis,
wherein the binary diffractive surface relief pattern comprises a plurality of ridges comprising sidewalls and separated by trenches, the plurality of ridges and the trenches having rectangular or trapezoidal cross-sections.

22. The method of claim 21, wherein the etching comprises reactive ion etching.

23. The method of claim 21, wherein the sidewalls are coated with the conforming metal layer to a thickness of at least 20 nm.

24. The method of claim 21, wherein the suspending comprises photolithographic definition and release of the platform for suspending over the substrate.

* * * * *